United States Patent [19]

Yagi

[11] Patent Number: 4,918,446

[45] Date of Patent: Apr. 17, 1990

[54] DECODER WITH REDUCED SYNCHRONIZATION CAPTURE TIME

[75] Inventor: Toshiharu Yagi, Tokyo, Japan

[73] Assignee: NEC Corporation, Tokyo, Japan

[21] Appl. No.: 251,487

[22] Filed: Sep. 30, 1988

[30] Foreign Application Priority Data

Sep. 30, 1987 [JP] Japan .................................. 62-248598

[51] Int. Cl.$^4$ .......................................... H03M 13/12
[52] U.S. Cl. ....................................... 341/94; 341/87; 341/107; 371/46
[58] Field of Search ....................... 341/67, 87, 93, 94, 341/95, 100, 101, 106, 107; 371/43, 44, 45, 46

[56] References Cited

U.S. PATENT DOCUMENTS

| | | | |
|---|---|---|---|
| 4,747,104 | 5/1988 | Piret | 371/44 |
| 4,805,174 | 2/1989 | Kubota | 371/43 |
| 4,855,742 | 8/1989 | Verboom | 341/95 |

Primary Examiner—William M. Shoop, Jr.
Assistant Examiner—H. L. Williams
Attorney, Agent, or Firm—Sughrue, Mion, Zinn, Macpeak & Seas

[57] ABSTRACT

A decoder is capable of decoding on a maximum likelihood basis coded symbols of requivalently high coding rate which are produced by deleting those code bits which are located at particular positions in a time sequence of convolutional symbols of low coding rate. The decoder includes a serial-to-parallel (SP) converter for converting a serial data sequence from a dummy bit inserter into parallel sequences. The frequency division phase of the SP converter is determined by a second timing signal which the dummy bit inserter produces in synchronism with a dummy bit inserted phase. A code synchronization is established, frequency division phase synchronization is automatically established. This eliminates the need for the repetitive trial for frequency division phase synchronization only and thereby reduces a synchronization capture time.

2 Claims, 4 Drawing Sheets

DECODER WITH REDUCED SYNCHRONIZATION CAPTURE TIME

BACKGROUND OF THE INVENTION

The present invention relates to a decoder and, more particularly, to a decoder of the type decoding, among others, equivalently high-rate codes which are produced by deleting codes bits at particular positions of a time sequence of low-rate convolutional code symbols by maximum likelihood decoding.

In communications art, an error correcting system which is the combination of convolutional coding and maximum likelihood decoding is available in order to correct transmission errors ascribable to a digital transmission path and thereby to enhance quality transmission. The error correcting capability of such a system increases with the decrease in coding rate (increase in redundancy) and with the increase in code constraint length. An increase in coding rate results in an increase in the number of bits of code symbols. On the other hand, the hardware of a Viterbi decoder or similar decoder using maximum likelihood decoding is exponentially scaled up as the number of bits of code symbols and the constraint length become greater, as well known in the art. For a radio transmission path whose available frequency band is severely limited, it is preferable to increase the coding rate to thereby reduce the redundancy on the path as far as possible and, yet, to adopt an error correcting system having a high error correcting capability for the purpose of promoting effective use of the frequency band. However, for coding rates greater than ¾, a Viterbi decoder is impractical.

In the light of the above, there has been proposed an error correcting system which uses a coder and a decoder adapted for low coding rates and each having a relatively small hardware scale together with some simple additional peripheral circuits, as disclosed in Japanese Laid-Open Patent Publication (Kokai) No. 57-155857 (KDD) by way of example. With such circuits, this system transmits codes over a transmission path after increasing their coding rate so as to use code symbols of equivalently high rate. The hardware scale of the coder and decoder may be ½ while the coding rate on the transmission path may be as high as ⅞. Such a system achieves a sufficiently high error correcting capability. Further, the coder and decoder may be so constructed as to render a deleting pattern or map changeable. The changeable deleting pattern will implement an error correcting system having coding rates of ½, ¾ and ⅞, for example.

A problem with the prior art decoder of an error correcting system of the kind described is as follows. The decoder performs code synchronization for the insertion of dummy bits and frequency division phase synchronization for the serial-to-parallel conversion of received data in which dummy bits are inserted, independently and on a trial-and-error basis. Hence, the total maximum necessary number of times of trials for both of code synchronization and frequency division phase synchronization is the product of the necessary maximum number of times of the individual synchronizations, resulting in an excessively long synchronization capture time.

SUMMARY OF THE INVENTION

It is therefore an object of the present invention to provide a decoder which reduces a synchronization capture time.

It is another object of the present invention to provide a decoder which decodes by maximum likelihood decoding equivalently high-rate codes which are produced by deleting codes bits at particular positions of a time sequence of low-rate convolutional code symbols.

It is another object of the present invention to provide a generally improved decoder.

A decoder of the present invention comprises a dummy bit inserter to which are serially inputted received data individually associated with second code bits which constitute a time sequence of second code symbols. The time sequence of second code symbols are produced by converting a time sequence of transmission data bits into a time sequence of first code symbols by convolutional coding and then deleting, in a group of first code bits which constitute a predetermined consecutive number of the first code symbols, those first code bits which are located in positions determined by a deleting pattern. The dummy bit inserter inserts in synchronism with the deleting pattern on a trial-and-error basis any dummy bits in those positions where the first code bits have been deleted, and outputs a time sequence of received data in which the dummy bits have been inserted together with a first timing signal indicative of the positions of the dummy bits and a second timing signal which is associated with the end of each of the first code symbol. A serial-to-parallel converter applies serial-to-parallel conversion to the time sequence of received data in which the dummy bits have been inserted and the first timing signal by using the second timing signal, and produces a time sequence of parallel data associated with the time sequence of the first code symbols and third timing signals which are parallel and indicative of positions of the dummy bits in the time sequence of parallel data. Maximum likelihood decoding means identifies the dummy bits out of the time sequence of parallel data by using the third timing signals, then decodes the time sequence of parallel data on a maximum likelihood basis by giving a predetermined maximum likelihood value to the dummy bits identified, and then outputs decoded data bits.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

To better understand the present invention, a brief reference will be made to the prior art error correcting system disclosed in Japanese Laid-Open Patent Publication No. 57-155857 as previously mentioned as well as to a coder and a decoder thereof.

Figure 1:
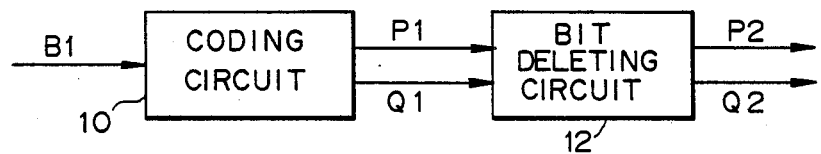
FIG. 1 is a schematic block diagram showing an example of a coder of an error correcting system to which the present invention is applicable.

FIG. 1 shows a coder which is included in the above-stated Laid-Open Patent Publication. The coder is generally comprised of a coding circuit 10 and a bit deleting circuit 12. The coding circuit 10 applies convolutional coding whose coding rate is $\frac{1}{2}$ and constraint length is 7 to a bit sequence B1 which is a time sequence of data bits to be transmitted. By such an operation, the circuit 10 produces two code bits which constitute one code symbol in parallel and in the form of bit sequences P1 and Q1. The bit deleting circuit 12 deletes those code bits of the bit sequences P1 and Q1 which are designated by a deleting pattern or map, then effects speed conversion, and then outputs a time sequence of rate $\frac{3}{4}$ or $\frac{7}{8}$ code symbols in the form of bit sequences P2 and Q2. Deleting patterns for the coding rates of $\frac{3}{4}$ and $\frac{7}{8}$ are shown in FIGS. 2A and 2B, respectively.

Figure 2A:
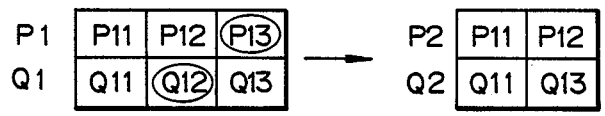
FIG. 2A shows a deletion pattern for a coding rate of ¾.
Figure 2B:
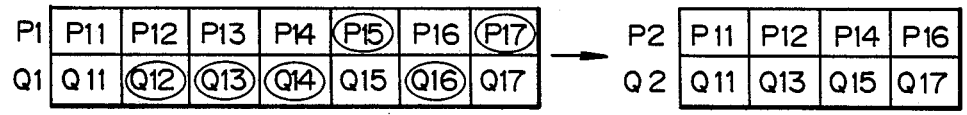
FIG. 2B shows a deletion pattern for a coding rate of ⅞.

As for the coding rate of $\frac{3}{4}$, six code bits (three code symbols) which are located in three consecutive blocks or time slots of the bit sequences P1 and Q1 are expressed as shown on the left-hand side of FIG. 2A, and the patterns at the positions of those blocks which are marked with circles are assumed to constitute a deleting pattern. The bit deleting circuit 12 deletes the circled code bits Q12 and P13 in the bit sequences P1 and Q1, then rearranges the remaining four code bits as shown on the right-hand side of FIG. 2A, and then outputs them after applying speed conversion. Since the remaining four code bits are associated wtih three data bits, the coding rate is $\frac{3}{4}$. As for the coding rate of $\frac{7}{8}$, as shown in FIG. 2B, six code bits with circles are deleted from fourteen code bits which are located in seven consecutive time slots of the bit sequences P1 and Q1, and the remaining eight code bits are rearranged to produce code symbols whose coding rate is $\frac{7}{8}$. As shown in FIGS. 2A and 2B, the code bits of the bit sequence P1 are sometimes introduced even in the bit sequence Q2 as a result of the rearrangement. In the light of this, the bit deleting circuit 12 deletes those bits after converting the bit sequences P1 and Q1 into a serial sequence and, then, transforms the remaining bits into parallel bit sequences P2 and Q2.

The decoder performs the following operation for decoding a time sequence of received data which are associated with the respective code bits of the bit sequences P2 and Q2 that are sent over a transmission path. First, dummy bits associated with the deleted code bits are inserted in the sequences of received data to produce data sequences which correspond to the original bit sequences P1 and Q1, respectively. This operation step is reverse to the step which the bit deleting circuit 12 performs. Specifically, the received data have to be converted into serial data beforehand for the same reason as for the bit deleting circuit 12. Inserting patterns for inserting dummy bits correspond one-to-one to the deleting patterns. However, since the correct phase of an inserting pattern for a received data sequence is not known at the time of bit insertion, it is necessary to find out the correct phase on a trial-and-error basis. More specifically, in a data sequence with dummy bits inserted therein, six different inserting patterns and fourteen different inserting patterns exist for the coding rates of $\frac{3}{4}$ and $\frac{7}{8}$, respectively. Hence, phase synchronization (hereinafter referred to as code synchronization) is unattainable without repeating a trial six times at maximum for the $\frac{3}{4}$ coding rate and fourteen times at maximum for the $\frac{7}{8}$ coding rate. The data sequence with dummy bits is converted into parallel sequences. While such one-to-two sequence conversion involves two different kinds of phase ambiguity occurring due to frequency division, the prior art decoder applies the trial-and-error principle even to the frequency division phase synchronization which is adapted to remove such ambiguity.

The two data sequences individually associated with the bit sequences P1 and Q1 are subjected to Viterbi decoding in a decoding circuit. The decoding circuit is identical with an ordinary Viterbi decoding circuit which is associated with the coding circuit 10, except that a predetermined likelihood value is given to dummy bits. In the even that dummy bits are inserted in the received data sequences, timing signals indicative of particular positions where dummy bits should be inserted are generated to allow the decoding circuit to identify the dummy bits out of the input data sequences.

The trial for code synchronization and frequency division phase synchronization are executed as follows.

The bit sequences outputted by the decoding circuit are coded by a coding circuit which is identical with the previously stated coding circuit 10 with respect to construction. Then, the output bit sequences of the coding circuit are compared on a bit basis with those bits which are representative of hard decision of data inputted to the decoding circuit except for the dummy bits. So long as both the code synchronization and the frequency division phase synchronization are accurate, the result of bit comparison is "coincidence" and, therefore, the frequency of "noncoincidence" is extremely low. However, when at least one of the two different kinds of synchronization is inaccurate, the frequency of noncoincidence is extremely large. As the frequency of noncoincidence exceeds a certain threshold, the trial for each of the two kinds of synchronization is repeated. The code synchronization and frequency division phase synchronization will be established after twelve consecutive trials at maximum for the $\frac{3}{4}$ coding rate ($6 \times 2 = 12$) and after twenty-eight consecutive trials at maximum for the $\frac{7}{8}$ coding rate ($14 \times 2 = 28$).

The interval between the time when the data are inputted to and decoded by the decoding circuit and the time when the decoded data are coded and outputted by the coding circuit is causative of a delay of about sixty bits for the $\frac{3}{4}$ coding rate and a delay of about 120 bits for the $\frac{7}{8}$ coding rate. It is therefore necessary that the hard decision of the individual data in the data sequences which are applied to the decoding circuit be delayed by the above-mentioned number of bits prior to the bit-by-bit comparison. This is implemented by a delay circuit having the same number of flip-flops as the delay bits. To eliminate bit comparison with the dummy bits, the dummy bits included in the delayed hard decision have to be identified. For such identification of dummy bits, the prior art decoder uses a delay circuit which is constructed in the same manner as a delay circuit adapted for hard decision so as to delay the timing signals which have been produced at the time of dummy bit insertion, the dummy bits being identified out of the hard decision which has been delayed by the delayed timing signals.

As discussed above, the prior art error correcting system is capable of transmitting data after converting them to the ¾ or ⅝ coding rate on the transmission path by use of, for example, a ½ coding circuit and a decoding circuit together with some simple additional peripheral circuitry. It has been proved that such a system achieves a sufficient error correcting capability. Further, the coder and decoder may be constructed to prepare alterable deleting patterns. This would implement a variable-rate error coding system having coding rates of ½, ¾ and ⅝. However, this kind of error correcting system has a drawback that the synchronization capture time is excessively long due to the prohibitive number of times of trials for synchronization, as stated earlier.

Figure 3:
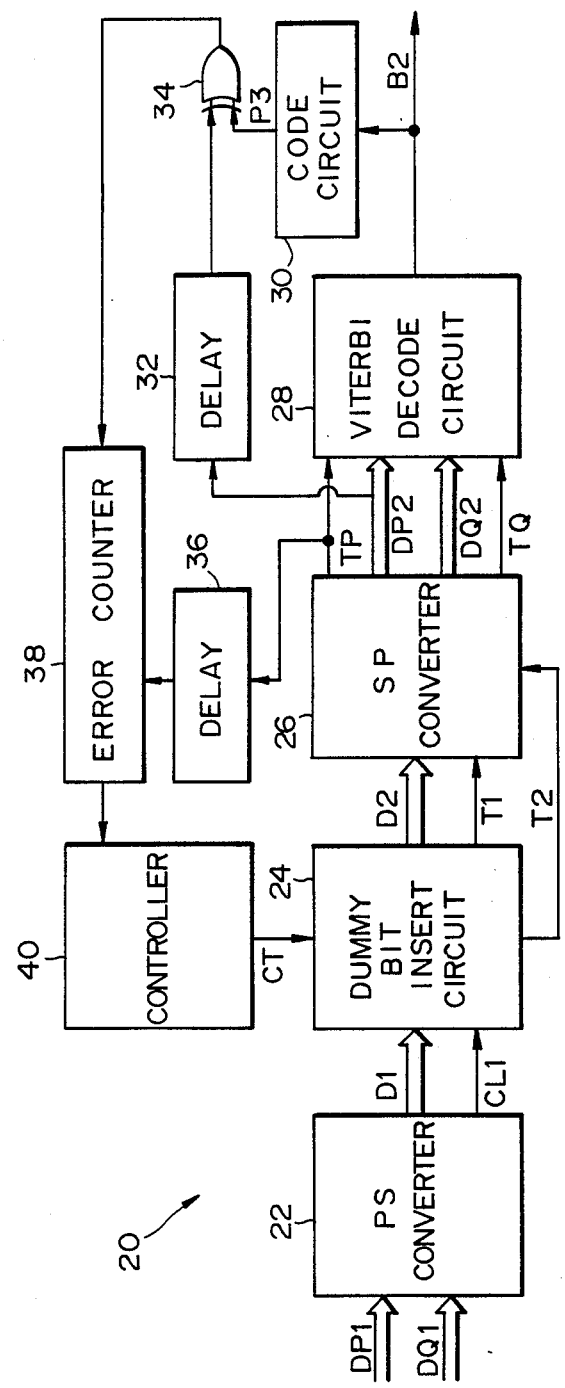
FIG. 3 is a block diagram schematically showing a decoder in accordance with the present invention.

Referring to FIG. 3, a decoder embodying the present invention is shown and generally designated by the reference numeral 20. In this embodiment, the decoder 20 decodes data sequences DP1 and DQ1 which are the time sequence of received data of 3-bit soft decision which in turn correspond respectively to the bit sequences P2 and Q2 that the coder of FIG. 1 produces as a time sequence of rate ¾ code suymbols, thereby outputting a bit sequence B2 which is the time sequence of decoded data bits. As shown, the decoder 20 includes a serial-to-parallel (SP) converter 22 for converting the 3-bit parallel data sequences DP1 and DQ1 into a 3-bit parallel data sequence D1 while producing a clock signal CL1 which is the clock of the data sequence D1. A dummy bit inserter 24 is provided which responds to the data sequence D1 and a clock signal CL1 as well as to a control signal CT for outputting a data sequence D2 and timing signals T1 and T2. A parallel-to-serial (PS) converter 26 is supplied with the data sequence D2 and timing signals T1 and T2 and in turn produces data sequences DP2 and DQ2 and timing signals TP and TQ. A Viterbi decoding circuit 28 outputs a bit sequence B2 in response to the data sequences DP2 and DQ2 and timing signals TP and TQ. A coding circuit 30 outputs a bit sequence P3 in response to the bit sequence B2. The most significant bit of each data of the data sequence DP2 is fed to a delay circuit 32. An Exclusive-OR (EX-OR) gate 34 produces Exclusive-OR of an output bit sequence of the delay circuit 32 and the bit sequence P3. The timing signal TP is also applied to a delay circuit 36. An error counter 38 is supplied with output signals of the delay circuit 36 and EX-OR gate 34. Further, a controller 40 is provided for outputting the control signal CT in response to an output signal of the error counter 38.

Figure 4:
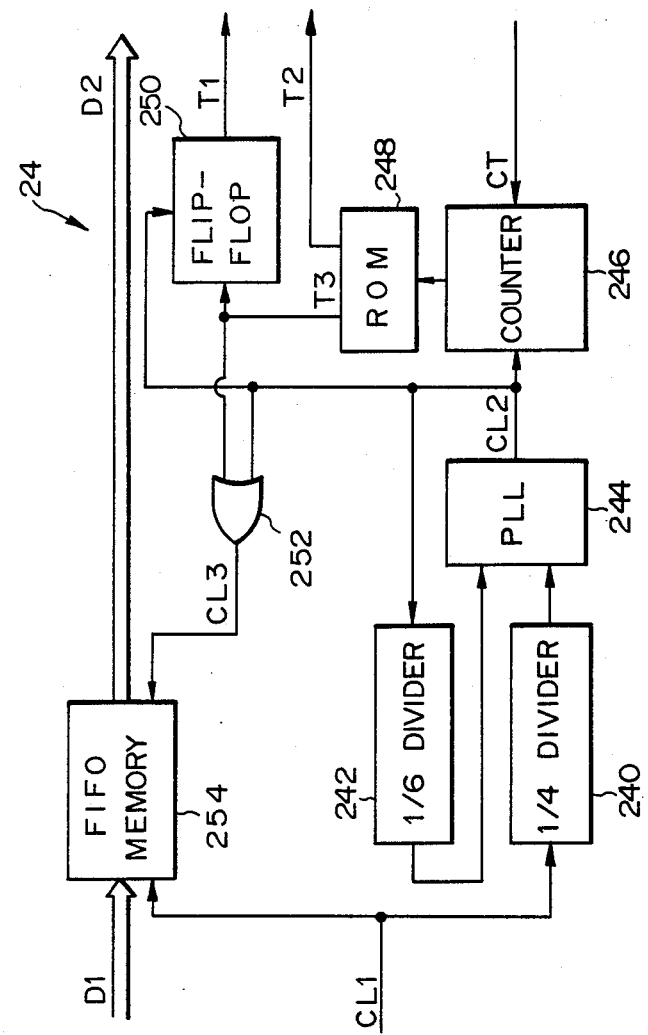
FIG. 4 is a schematic block diagram showing a specific constructin of a dummy bit inserter which is included in the decoder of FIG. 3.

FIG. 4 shows a specific construction of the dummy bit inserter 24. As shown, the dummy bit inserter 24 includes a ¼ frequency divider 240 for dividing the clock signal CL1 by "4", and a 1/6 frequency divider 242 for dividing the clock signal CL2 by "6". The dummy bit inserter 24 also includes a phase-locked loop (PLL) 244 for outputting the clock signal CL2 in response to an output signal of the ¼ and 1/6 frequency dividers 240 and 242, a modulo 6 hexanary counter 246 for counting the clock signals CL2 with its initial value being controlled by the control signal CT, and a ROM 248 from which the timing signals T2 and T3 are read out while the counter 246 designates the addresses. The dummy bit inserter 24 further includes a flip-flop 250 which is supplied with the timing signal T3 clocked by the clock signal CL2 to produce the timing signal T1, an OR gate 252 for ORing the clock signal CL2 and the timing signal T3 to produce a clock signal CL3, and a first-in-first-out (FIFO) memory 254 which writes the data sequence D1 using the clock signal CL1 as a write clock and reads out the data sequence D2 using the clock signal CL3 as a read clock.

Figure 5:
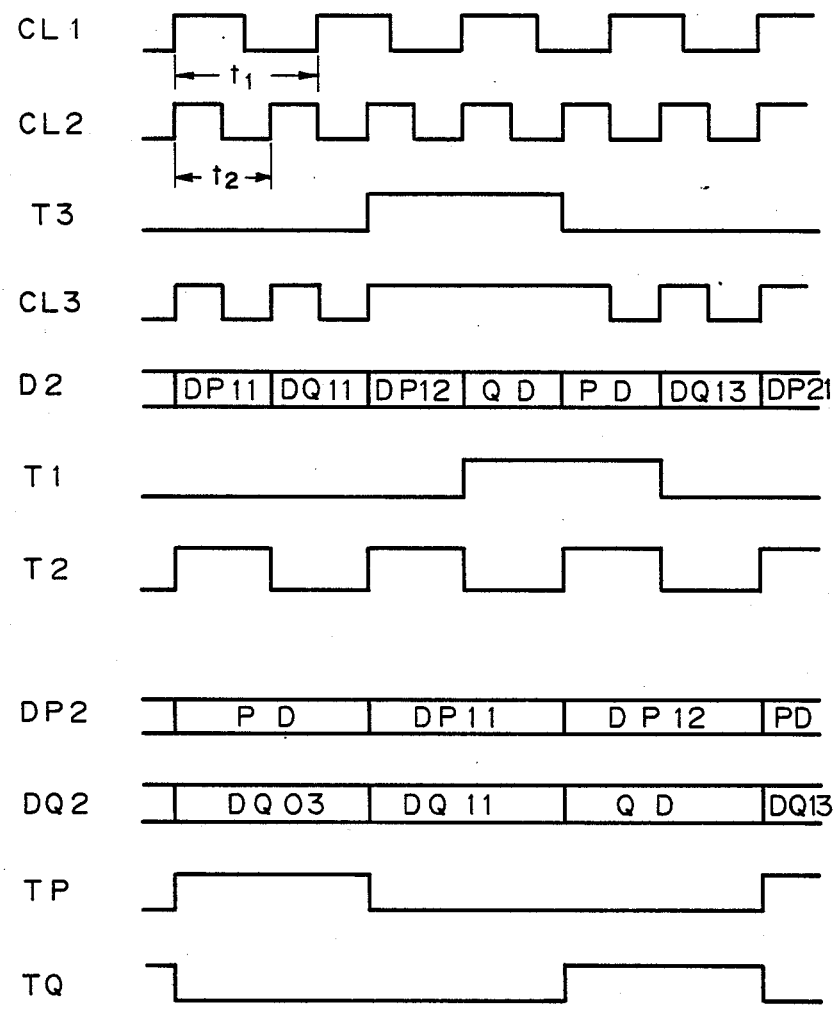
FIG. 5 is a timing chart useful for understanding the operation of the decoder shown in FIG. 3.

Referring to FIG. 5, a timing chart useful for understanding the operation of the decoder 20 is shown. Received data DP11 and DQ12 and received data DP12 and DQ12 respectively associated with the code bits P11 and P12 and the code bits Q11 and Q13 of the bit sequences P2 and Q2 shown in FIG. 2A are converted into a serial sequence by the PS converter 22. Consequently, the data DP11, DQ11, DP12 and DQ13 are sequentially written in the FIFO memory 254 of the dummy bit inserter 24 in this order.

The PLL 244 cooperates with the ¼ and 1/6 frequency dividers 242 to generate the clock signal CL2 which is synchronous with the clock signal CL1 and has a period of $t_2$ which is one half of the period $t_1$ of the clock signal CL1. The ROM 248 produces the timing signals T2 and T3 at the intervals of $6t_2$, as shown in FIG. 5. The clock signal CL3 has an inherent waveform as shown in FIG. 5 and, hence, the number of received data which are read out of the FIFO memory 254 over the period of time of $6t_2$ is the same as the number of received data which are written in the memory 254 during that period of time ($6t_2 = 4t_1$). The timing signals T2 and T3 shown in FIG. 5 appear on condition that the initial phase of the counter 246 is correct. In this case, the received data DP11, DQ11 and DP12 are sequentially read out at the intervals of $t_2$ and, then, the received data DQ13 is read out at the interval of $3t_2$. Stated another way, the received data DP12 read out has a time width of $3t_2$. However, regarding that the received data DP12, a dummy bit QD and a dummy bit PD each having a duration of $t_2$ sequentially appear during the time width of $3t_2$ (as is the case with the data sequence D2 of FIG. 5), the situation is the same as inserting the dummy bits DQ and PD between the received data DP12 and DQ13. Since the timing signal T1 is delayed by $t_2$ relative to the timing signal T3, a (logical) ONE of the timing signal T1 is indicative of a position where the dummy bits QD and pD have been inserted.

The SP converter 26 converts the serial data sequence D2 into parallel sequences in which the data located at the position where the timing signal T2 is a ONE are arranged in the data seqence DP2 and the immediately following data is arranged in the same time slot of the data sequence DQ2. By comparing FIGS. 5 and 2A, it will be clear that the data sequences DP2 and DQ2 correspond to the bit sequences P1 and Q1, respectively. Hence, the timing signal T2 is associated with the end of each code symbol having a coding rate of ½. The timing signal T1 is subjected to serial-to-parallel conversion in exactly the same manner as the data sequence D2 to become timing signals TP and TQ, respectively. It follows that the position where the timing signals TP and TQ individually become a ONE is indicative of a position where the dummy bits PD and QD have been inserted. By using the timing signals TP and TQ, the Viterbi decoding circuit 28 identifies the dummy bits out of the data sequences DP2 and DQ2, then gives a predetermined likelihood value to the identified dummy bits to decode the data sequences DP2 and DQ2 on the maximum likelihood basis, and then outputs the decoded data bits in the form of a bit sequence B2. The Viterbi decoding circuit 28 may be identical in construction with an ordinary Viterbi decoding circuit which corresponds to the coding circuit 10, except that a predetermined likelihood value is given to dummy bits.

The coding circuit 30 plays exactly the same role as the coding circuit 10 of FIG. 1, i.e., it outputs bit sequences P3 and Q3 (not shown) by coding the bit sequence B2. Here, the bit sequence Q3 is not used. The most significant bits of the data sequence DP2 (representative of hard decision) are individually delayed by the delay circuit 32 by an amount which is associated with the bit delay ascribable to the Viterbi decoding circuit 28 and coding circuit 30, and, then, compared on a bit basis with the bit sequence P3 by the EX-OR gate 34. The EX-OR gate 34 produces a ONE only when the result of comparison is "noncoincidence". The delay circuit 36 delays the timing signal TP such that a ONE appears when the delay circuit 32 outputs a dummy bit. The error counter 38 counts the number of times that the EX-OR gate 34 produces a ONE. This counter 38 is reset at predetermined intervals and stops counting while a ONE is applied thereto from the delay circuit 36. Therefore, an instantaneous count of the error counter 9 shows how many times noncoincidence has occurred in the bit comparison of the hard decision of data sequence DP2 and the bit sequence P3 except for the bit comparison of dummy bits. When the error counter 38 is incremented beyond a predetermined value, i.e., when the frequency of noncoincidence exceeds a predetermined value, the controller 40 controls the counter 246 of the dummy bit inserter 24 with the control signal CT so as to shift its output by "1".

Assume that the actual initial value of the counter 246 was greater than the expected initial value by "1", for example. Then, the waveform of the timing signal T3 (and that of the timing signal T2) is deviated from that of FIG. 5 by the time $t_2$ with the result that dummy bits are inserted between the received data DQ11 and DP12 in the data sequence D2. When dummy bits are inserted in an unexpected position as stated, the data sequences DP2 and DQ2 are brought out of correspondence with the bit sequences P1 and Q1. In this condition, the Viterbi decoding circuit 28 produces decoding errors in the bit sequence B2 frequently and, therefore, the frequency of noncoincidence in the bit comparison by the EX-OR 34 is increased. This causes the output value of the counter 246 to be shifted by "1" to thereby shift the phase of the timing signal T3 by an amount which is associated with the period of time $t_2$. Since the timing signal T3 is a repetitive signal having a period of $6t_2$, repeating the shift of the phase by an amount associated with the period of time $t_2$ six times allows the phase to be restored to original via all possible phases. Such a sequence of phases includes a correct phase so that code synchronization can be established without fail by repeating the trial of shifting the output of the counter 246 by "1" six times at maximum. The timing signal T2 adapted to determine the frequency division phase of the SP converter 26 is read out of the ROM 248 together with the timing signal T3 by the output of the counter 246 and is synchronous with the timing signal T3. Therefore, once accurate code synchronizatin in the dummy bit inserter 24 is set up, the frequency division phase synchronization in the SP converter 26 becomes correct automatically.

As previously described, the delay circuit 32 needs about sixty flip-flops, and the prior art decoder has a delay circuit which corresponds to the delay circuit 36 and is constructed in the same manner as the delay circuit 32. However, if the timing signal TP which is outputted by the delay circuit 36 and is a repetitive signal whose repetition period is equal to three time slots of the data sequence DP2 is outputted as it is or if the timing signal TP is delayed by one or two time slots of the data sequence DP2 by two flip-flops, either one of such outputs will become a ONE with accuracy when the delay circuit 32 outputs a dummy bit. Hence, the delay circuit 36 is constituted by two or less flip-flops (inclusive of zero). The delay circuit 36 implemented by such a small number of flip-flops contributes a great deal to the simplification of the constructed described above with reference to FIG. 3.

The embodiment of the present invention has been shown and described in relation to a time sequence of rate ¾ code symbols which are derived from a time sequences of code symbols of convolutional codes whose coding rate is ½.

It should be noted that the PS converter 22 is omissible when received data are inputted in series from a transmission path.

In the case of ⅞ coding rate, the ¼ frequency divider 240, 1/6 frequency divider 242 and counter 246 are replaced with a ⅛ freqency divider, 1/14 frequency divider and modulo 14 quatdecimal counter, respectively, and the ROM 248 is replaced with a ROM which is associated with the deleting pattern of FIG. 2B. In such a case, the delay circuit 36 can be implemented by six or less flip-flops.

In summary, it will be seen that the present invention provides a decoder in which a data sequence outputted in series by a dummy bit inserter are converted by a serial-to-parallel converter the frequency division phase of which is determined by a second timing signal which is outputted by the dummy bit inserter in synchronism with a dummy bit insertion phase. Hence, frequency division phase synchronization is automatically achieved when code synchronization is set up. This eliminates the need for repetitive trial for frequency division phase synchronization only and thereby reduces the synchronization capture.

Various modifications will become possible for those skilled in the art after receiving the teachings of the present disclosure without departing from the scope thereof.

What is claimed is:

1. A decoder comprising:
dummy bit inserting means to which are serially inputted received data individually associated with second code bits which constitute a time sequence of second code symbols, said time sequence of second code symbols being produced by converting a time sequence of transmission data bits into a time sequence of first code symbols by convolutional coding and then deleting, in a group of first code bits which consitute a predetermined consecutive number of said first code symbols, those of said first code bits which are located in positions determined by a deleting pattern, said dummy bit inserting means inserting in synchronism with said deleting pattern on a trial-and-error basis any dummy bits in those positions where said first code bits have been deleted, and outputting a time sequence of received data in which said dummy bits have been inserted together with a first timing signal indicative of the positions of said dummy bits and a second timing signal which is associated with an end of each of said first code symbol;

serial-to-parallel converting means for applying serial-to-parallel conversion to the time sequence of received data in which the dummy bits have been inserted and the first timing signal by using the second timing signal, and producing a time sequence of parallel data associated with the time sequence of the first code symbols and third timing signals which are parallel and indicative of positions of the dummy bits in said time sequence of parallel data; and maximum likelihood decoding means for identifying the dummy bits out of the time sequence of parallel data by using the third timing signals, then decoding the time sequence of parallel data on a maximum likelihood basis by giving a predetermined maximum likelihood value to said dummy bits identified, and then outputting decoded data bits.

2. A decoder as claimed in claim 1, further comprising coding means for producing coded bits by coding a time sequence of the decoded data bits from said maximum likelihood decoding means by convolutional decoding to produce coded bits;

first delay means for delaying most significant bits of the time sequence of the parallel data by an amount associated with a bit delay which is caused by said maximum likelihood decoding means and said coding means;

Exclusive-OR means for comparing the most significant bits delayed and the coded bits on a bit basis and producing a logical output in the event of non-coincidence;

second delay means for delaying the third timing signal such that said exclusive-OR means produces the logical output when said first delay means outputs the dummy bits;

error counter means for counting a number of times that said Exclusive-OR means produces the logical output and stopping counting while an output of said second delay means is applied to said error counter; and control means for generating a control signal when a count of said error counter means exceeds a predetermined value, said control signal being fed to said dummy bit inserting means.

* * * * *

UNITED STATES PATENT AND TRADEMARK OFFICE
CERTIFICATE OF CORRECTION

PATENT NO. : 4,918,446

DATED : April 17, 1990

INVENTOR(S) : Yagi

It is certified that error appears in the above-identified patent and that said Letters Patent is hereby corrected as shown below:

Title Page- In the Abstract, line 2, delete "requivalently" and insert --equivalently--.

Col. 2, line 65, delete "constructin" and insert --construction--.

Col. 6, line 47, delete "seqence" and insert --sequence--.

Col. 7, line 61, delete "synchronizatin" and insert --synchronization--.

Signed and Sealed this

Twentieth Day of August, 1991

Attest:

HARRY F. MANBECK, JR.

*Attesting Officer*  *Commissioner of Patents and Trademarks*